United States Patent [19]
Takano

[11] Patent Number: 5,374,862
[45] Date of Patent: Dec. 20, 1994

[54] SUPER BUFFER AND DCFL CIRCUITS WITH SCHOTTKY BARRIER DIODE

[75] Inventor: Chiaki Takano, Kanagawa, Japan

[73] Assignee: Sony Corporation, Tokyo, Japan

[21] Appl. No.: 19,440

[22] Filed: Feb. 18, 1993

[30] Foreign Application Priority Data

Feb. 28, 1992 [JP] Japan .................. 4-079297

[51] Int. Cl.$^5$ ............... H03K 19/094; H03K 19/017.5
[52] U.S. Cl. .................... 326/112; 326/17; 327/581
[58] Field of Search ................. 307/448, 304

[56] References Cited

U.S. PATENT DOCUMENTS

| | | | |
|---|---|---|---|
| 3,299,291 | 1/1967 | Warner, Jr. et al. | 307/448 |
| 4,639,621 | 1/1986 | Ikawa et al. | 307/304 |
| 4,716,311 | 12/1987 | Davenport et al. | 307/448 |
| 4,810,905 | 3/1989 | Graham et al. | 307/448 |
| 4,810,969 | 3/1989 | Fulkerson | 307/448 |
| 4,918,336 | 4/1990 | Graham et al. | 307/448 |

OTHER PUBLICATIONS

Research Disclosure, No. 327, Jul. 1991, Emsworth, GB, p. 569 "Superbuffer Logic Circuit with Diode For Lower Supply voltage".

Elektronik, vol. 38, No. 26, Dec. 22, 1989, Muenchen, DE pp. 44–50, H. Lemme, pp. 44–45, FIGS. 12–14.

Patent Abstracts of Japan, vol. 10, No. 313 (E–448) Oct. 24, 1986, JP-A-61 125 069 (Agency of Industrial Science & Technology) Jun. 12, 1986, abstract "GaAs Logic Integrated Circuit".

Primary Examiner—Edward P. Westin
Assistant Examiner—Richard Roseen
Attorney, Agent, or Firm—Hill, Steadman & Simpson

[57] ABSTRACT

In a GaAs IC using an E/R type DCFL circuit or E/D type DCFL circuit, a Schottky barrier diode is connected between the positive polarity power source of the DCFL circuit and a load element. A deterioration of switching speed is prevented even in case of using a power source voltage of 2 V in the GaAs IC. Addition of the Schottky barrier diode in a super buffer circuit to prevent a slow increase in output voltage in the circuit is also disclosed.

6 Claims, 5 Drawing Sheets

SUPER BUFFER AND DCFL CIRCUITS WITH SCHOTTKY BARRIER DIODE

BACKGROUND OF THE INVENTION

1. Field of the Invention

The invention relates to an integrated circuit device made by compound semiconductor and, more particularly, to such an integrated circuit device using a direct coupled FET logic (DCFL) circuit as a logic gate.

2. Description of the Prior Art

A compound semiconductor integrated circuit device comprising an E/R (Enhancement/Resistor) type DCFL circuit using an enhancement-mode n-channel junction FET and a load resistor which are formed on a GaAs (gallium arsenide) substrate is suitable for an ultrahigh speed LSI because an operating speed is high and an electric power consumption is low and it has a large noise margin.

FIG. 1 shows a conventional E/R type DCFL circuit and shows an example of a 2-input NOR logic circuit. As shown in FIG. 1, the E/R type DCFL circuit is a digital circuit in which a circuit comprising two enhancement-mode junction FETs $Q_1'$ and $Q_2'$ and a load resistor $R'$ which are serially connected is used as one logic gate. A positive polarity power source to supply a power source voltage $V_{DD}$ is connected to one end of the load resistor $R'$. A negative polarity power source to supply a power source voltage $V_{SS}$ is connected to One end (source) of each of the enhancement-mode junction FETs $Q_1'$ and $Q_2'$.

The operation of the E/R type DCFL circuit shown in FIG. 1 will now be described hereinbelow.

First, in the enhancement-mode junction FETs $Q_1'$ and $Q_2'$, when a positive voltage exceeding a threshold voltage (about 0.2 V) for source electrodes is applied to gate electrodes, a current flows between the source and drain. When a gate voltage is lower than the threshold voltage or is set to a negative potential for the source, those transistors are in the OFF state and no current flows between the source and drain.

When a voltage which is equal to or lower than the threshold voltage for the power source voltage $V_{SS}$ of the negative polarity power source is applied to both of input terminals A and B, the two enhancement-mode junction FETs $Q_1'$ and $Q_2'$ are turned Off and not current flows between the source and drain, so that a voltage drop due to the load resistor $R'$ does not occur. Therefore, a voltage which is equal to the power Source voltage $V_{DD}$ of the positive polarity power source is generated to an output terminal OUT. On the other hand, when a voltage which is equal to or higher than the threshold voltage for the power source voltage $V_{SS}$ of the negative polarity power source is applied to at least one Of the input terminals A and B, the two enhancement-mode junction FETs $Q_1$ and $Q_2'$ are turned on and a current flows between the source and drain, so that a voltage which is lower than the power source voltage $V_{DD}$ of the positive polarity power source by the voltage drop due to the load resistor $R'$ is generated to the output terminal OUT due to the voltage drop due to the load resistor $R'$. A difference between those voltages is handled as logic "1" and "0".

As a DCFL circuit of a construction different from the above E/R type DCFL circuit, there is an E/D (Enhancement/Depletion) type DCFL circuit using an enhancement-mode n-channel junction FET and a depletion-mode n-channel junction FET which are formed on a GaAs substrate. Similarly to the E/R type DCFL circuit, the E/D type DCFL circuit is also suitable for an ultrahigh speed LSI because an operating speed is high and an electric power consumption is low and it has a large noise margin.

FIG. 2 shows a conventional E/D type DCFL circuit and shows an example of a 2-input NOR logic circuit. As shown in FIG. 2, such an E/D type DCFL circuit is a digital circuit in which a circuit comprising two enhancement-mode junction FETs $Q_1'$ and $Q_2'$ and a depletion-mode junction FET $Q_3'$ (load element) which are serially connected is used as one logic gate. The E/D type DCFL circuit uses the depletion-mode junction FET $Q_3'$ in place of the load resistor $R'$ in the E/D type DCFL circuit shown in FIG. 1. A positive polarity power source to supply the power source voltage $V_{DD}$ is connected to One end (drain) of the depletion-mode junction FET $Q_3'$. A negative polarity power source to supply the power source voltage $V_{SS}$ is connected to one end (source) of each of the enhancement-mode junction FETs $Q_1'$ and $Q_2'$.

Since the operation of the E/D type DCFL circuit shown in FIG. 2 is similar to the operation of the E/R type DCFL circuit shown in FIG. 1 except that a voltage drop occurs in the depletion-mode junction FET $Q_3'$, its description is omitted here.

In the compound semiconductor integrated circuit device using the above E/R type DCFL circuit or E/D type DCFL circuit, in the case where a large load capacitance due to a long wiring or the like must be driven, a circuit having excellent current drivability called a super buffer circuit (also referred to as a push pull circuit) as shown in FIG. 3 is frequently used.

As shown in FIG. 3, the super buffer circuit is a circuit in which an enhancement-mode junction FET $Q_4'$ and a load element $L'$ are serially connected and an enhancement-mode junction FET $Q_5'$ and an enhancement-mode junction FET $Q_6'$ are serially connected. An FET in case of using a resistor as a load element $L'$ corresponds to the E/R type. An FET in case of using a depletion-mode junction FET as a load element $L'$ corresponds to the E/D type. One end of the load element $L'$ and one end (drain) of the enhancement-mode junction FET $Q_6'$ are connected to a positive polarity power source to supply the power source voltage $V_{DD}$. One end (source) of each of the enhancement-mode junction FET $Q_4'$ and the enhancement-mode junction FET $Q_5'$ is connected to a negative polarity power source to supply the power source voltage $V_{SS}$. A common gate voltage is applied to gate electrodes of the enhancement-mode junction FETs $Q_4'$ and $Q_5'$. A connection point of the enhancement-mode junction FET $Q_4'$ and the load element $L'$ is connected to a connection point of the enhancement-mode junction FETs $Q_5'$ and $Q_6'$.

The operation of the super buffer circuit shown in FIG. 3 will now be described hereinbelow.

First, in each of the enhancement-mode junction FETs $Q_4'$, $Q_5'$, and $Q_6'$, when a positive voltage exceeding a threshold voltage (about 0.2 V) for the source electrode is applied to the gate electrode, a current flows between the source and drain. However, when the gate voltage is lower than the threshold voltage or is set to a negative potential for the source, the FET is in the OFF state and no current flows between the source and drain.

When a voltage which is equal to or lower than the threshold voltage for the power source voltage $V_{SS}$ of the negative polarity power source is applied to an input terminal C, the enhancement-mode junction FET $Q_4'$ is turned off and no current flows between the source and drain, so that a voltage drop due to the load element L' does not occur. Therefore, a voltage which is equal to the power source voltage $V_{DD}$ of the positive polarity power source is applied to the gate electrode of the enhancement-mode junction FET $Q_6'$. Thus, the enhancement-mode junction FET $Q_6'$ is turned on. On the other hand, the enhancement-mode junction FET $Q_5'$ is in the OFF state because the same gate voltage as that of the enhancement-mode junction FET $Q_4'$ is applied to the gate electrode. Thus, a voltage near the power source voltage $V_{DD}$ Of the positive polarity power source appears at the output terminal OUT.

When a voltage which is equal to or higher than the threshold voltage for the power source voltage $V_{SS}$ of the negative polarity power source is applied to the input terminal C, the enhancement-mode junction FET $Q_4'$ is turned on and a current flows between the source and drain, so that a voltage which is lower than the power source voltage $V_{DD}$ of the positive polarity power source by the voltage drop due to the load resistor L' is applied to the gate electrode of the enhancements mode junction FET $Q_6'$ due to the voltage drop by the load element L'. Therefore, the enhancement-mode junction FET $Q_6'$ is turned off. On the other hand, the enhancement-mode junction FET $Q_5'$ is in the ON state because the same gate voltage as that of the enhancement-mode junction FET $Q_4'$ is applied to the gate electrode. Thus, a voltage near the power source voltage $V_{SS}$ of the negative polarity power source appears at the output terminal OUT. A difference between those voltages is handled as logic "1" and "0".

In the above conventional E/R type DCFL circuit shown in FIG. 1, since the output voltage from the output terminal OUT is applied to the input terminal of the circuit at the next stage, when the power source voltage $V_{DD}$ is increased, a voltage of 1.2 V or higher is applied to the gate electrode of the enhancement-mode junction FET at the next stage from a time point at which the power source voltage $V_{DD}$ exceeds 1.2 V, so that holes are injected into the GaAs substrate from the gate electrode. A switching time of the circuit increases due to the accumulation effect of the holes, so that a switching speed decreases (refer to FIG. 4). Therefore, in the conventional compound semiconductor integrated circuit device using the above E/R type DCFL circuit, the power source voltage $V_{DD}$ within a range from 1.0 to 1.2 V must be used. When considering the case of actually using the LSI, however, the use of the power source voltage of e.g., 1.2 V in the GaAs IC means that there is no compatibility of the power source voltage with a silicon (Si) IC. Therefore, there is a problem such that in case of using the GaAs IC together with, for instance, an Si IC, a special power supply circuit is needed for only the GaAs IC.

The above problem also similarly occurs in the conventional E/D type DCFL circuit shown in FIG. 2 mentioned above.

On the other hand, in the conventional super buffer circuit shown in FIG. 3 mentioned above, just after completion of the switching Operation, for a period of time during which the voltage at the source terminal of the enhancement-mode junction FET $Q_6'$, namely, the output voltage from the output terminal OUT is lower than the power source voltage $V_{DD}$ by the threshold voltage, that is, for a period of time when the enhancement-mode junction FET $Q_6'$ is ON, the load capacitance is charged at a high speed by a drain current of the enhancement-mode junction FET $Q_6'$ and the output voltage increases at a high speed as shown in a region 1 in FIG. 5. However, after that, when the time elapses in such a state, the load capacitance is charged little by little by a slight leak current of the enhancement-mode junction FET $Q_6'$. There is, consequently a problem such that the output voltage slowly rises to the power source voltage $V_{DD}$ of the positive polarity power source as shown in a region 2.

To solve the above problem, there is a method of increasing the power source Voltage $V_{DD}$ (for instance, to 2 V) and clamping the output Voltage by the rising characteristics of the diode between the gate and source of the junction FET at the next stage. According to the above method, since the output voltage is clamped by the diode between the gate and source of the junction FET at the next stage, the foregoing problem such that the output voltage slowly rises up to the power source voltage $V_{DD}$ does not occur. However, there is a problem such that since a voltage of 1.2 V or higher is applied to the gate electrode of the junction FET at the next stage and holes are injected into the GaAs substrate from the gate electrode, the switching speed is decreased due to the accumulation effect of the holes.

OBJECTS AND SUMMARY OF THE INVENTION

It is, therefore, an object of the invention to provide an integrated circuits device made by compound semiconductor which can prevent the occurrence of the deterioration of a switching speed even when a power source voltage of 2 V is used.

The above and other objects of the present invention will become apparent from the detailed description of the specification and the appended drawings.

According to an aspect of the invention, there is provided an integrated circuit device made by compound semiconductor in which a direct coupled FET logic circuit comprising at least one enhancement-mode junction FET and a resistor serially connected to the enhancement-mode junction FET is used and in Which a first power source to supply a first power source voltage is connected to one end of the resistor and a second power source to supply a second power source voltage lower than the first power source voltage is connected to one end of the enhancement-mode junction FET, wherein a diode and the resistor are serially connected between the first power source and an output terminal of the direct coupled FET logic circuit.

According to another aspect of the invention, there is provided an integrated circuit device made by compound semiconductor in which a direct coupled FET logic circuit comprising at least one enhancement-mode junction FET and a depletion-mode junction FET serially connected to the enhancement-mode junction FET is used and in which a first power source to supply a first power source voltage is connected to one end of the depletion-mode junction FET and a second power source to supply a second power source voltage lower than the first power source voltage is connected to one end of the enhancement-mode junction FET, wherein a diode and the depletion-mode junction FET are serially connected between the first power source and an output terminal of the direct coupled FET logic circuit.

According to the integrated circuit devices made by compound semiconductor which are constructed as mentioned above, since the diode and the resistor or the depletion-mode junction FET are serially connected between the first power source and the output terminal of the direct coupled FET logic circuit, when the enhancement-mode junction FET is OFF, no current flows between the source and drain, so that even when no voltage drop occurs due to the resistor, a voltage drop which is substantially the same as the turn-on voltage can be caused by the diode. Therefore, the output voltage from the output terminal of the direct coupled FET logic circuit can be reduced by the voltage drop due to the diode. Consequently, it is possible to prevent that the holes are injected into the compound semiconductor substrate from the gate electrode of the enhancement-mode junction FET of the input section of the circuit at the next stage and the switching speed is decreased.

According to still another aspect of the invention, there is further provided in the integrated circuit made by compound semiconductor devices which are constructed as mentioned above, a buffer circuit which comprises a first enhancement-mode junction FET and a load which are serially connected and a second enhancement-mode junction FET, a third enhancement-mode junction FET and a diode which are serially connected, and in which a common gate voltage is applied to the first enhancement-mode junction FET and the second enhancement-mode junction FET, a connection point of the first enhancement-mode junction FET and the load is connected to a gate terminal of the third enhancement-mode junction FET, a third power source to supply a third power source voltage is connected to one end of the load and an anode of the diode, and a fourth power source to supply a fourth power source voltage is connected to one end of the first enhancement-mode junction FET and one end of the second enhancement-mode junction FET.

According to the integrated circuit device made by compound semiconductor which is constructed as mentioned above, since the diode is connected between the third power source and the third enhancement-mode junction FET, the voltage as much as the voltage drop due to the diode is applied between the gate and source of the third enhancement-mode junction FET and the ON state is held. Therefore, not only just after completion of the switching operation but also after that, the load capacitance can be rapidly charged through the third enhancement-mode junction FET. Consequently, it is possible to prevent the occurrence of a slow change in output voltage as a problem in the conventional super buffer circuit.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Figure 1:
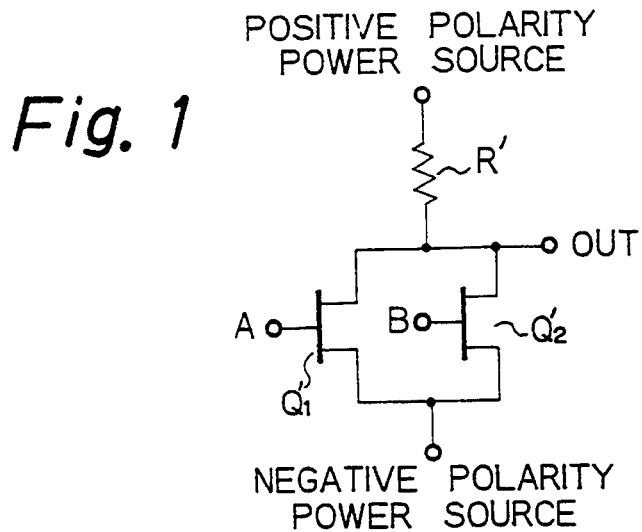
FIG. 1 is a circuit diagram showing a conventional E/R type DCFL circuit using junction FETs.

Embodiments of the present invention will be described hereinbelow with reference to the drawings. In all of the diagrams, the same or corresponding portions are designated by the same reference numerals.

Figure 6:
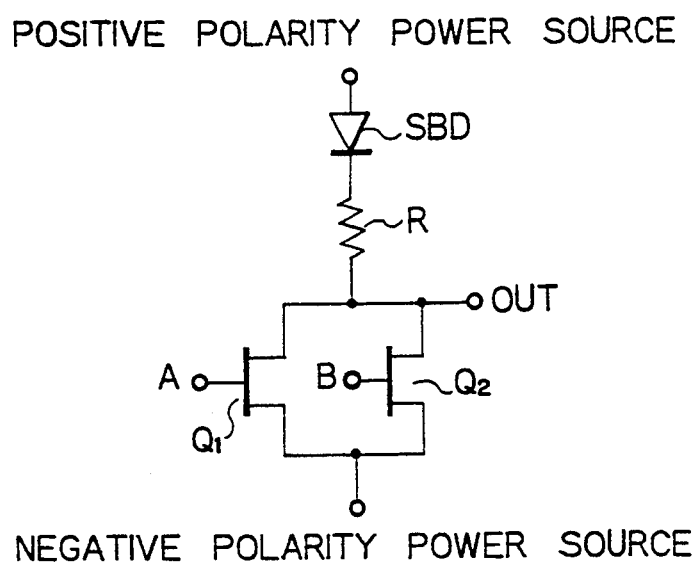
FIG. 6 is a circuit diagram showing an E/R type DCFL circuit which is used in a compound semiconductor integrated circuit device according to the first embodiment of the present invention.

FIG. 6 shows a compound semiconductor integrated circuit device according to the first embodiment of the present invention.

As shown in FIG. 6, in the compound semiconductor integrated circuit device according to the first embodiment, one logic gate is constructed by an E/R type DCFL circuit in which two enhancement-mode junction FETs $Q_1$ and $Q_2$ and a load resistor R are serially connected and a Schottky barrier diode SBD is connected between the load resistor R and a positive polarity power source to supply the power source voltage $V_{DD}$. Such an example corresponds to a 2-input NOR logic circuit. A negative polarity power source to supply the power source voltage $V_{SS}$ is connected to one end (source) of each of the enhancement-mode junction FETs $Q_1$ and $Q_2$.

That is, the compound semiconductor integrated circuit device according to the first embodiment can be regarded as a device in which the Schottky barrier diode SBD is connected between the load resistor R' and the positive polarity power source in the conventional E/R type DCFL circuit shown in FIG. 1.

The operation of the E/R type DCFL circuit shown in FIG. 6 is as follows.

The power source voltage $V_{DD}$ of the positive polarity power source and the power source voltage $V_{SS}$ of the negative polarity power source are selected so that a difference between the power source voltages $V_{DD}$ and $V_{SS}$ is equal to 2.0 V. For instance, $-2.0$ V which is used as a power source voltage in an Si ECL (Emitter Coupled Logic) IC is used. In this case, the power source voltage $V_{DD}$ of the positive polarity power source is set to 0 V and the power source voltage $V_{SS}$ of the negative polarity power source is set to $-2.0$ V.

In the enhancements mode junction FETs $Q_1$ and $Q_2$, when a positive voltage exceeding a threshold voltage (about 0.2 V) for the source electrode is applied to the gate electrode, a current flows between the source and drain. However, when the gate voltage is lower than the threshold voltage or is set to the negative potential for the source, those FETs are in the OFF state and no current flows between the source and drain.

First, when a voltage which is equal to or higher than the threshold voltage for the power source voltage $V_{SS}$ of the negative polarity power source is applied to at least one of the input terminals A and B, the two enhancement-mode junction FETs $Q_1$ and $Q_2$ are turned on and a current follows between the source and drain. Therefore, an enough lower voltage which is lower than the power source voltage $V_{DD}$ of the positive polarity power source by the voltage drop due to the load resistor R and Schottky barrier diode SBD is generated to the output terminal OUT. The potential at the output terminal OUT in this instance is set to logic "0".

On the other hand, when a voltage which is equal to or lower than the threshold voltage (about 0.2 V) for the power source voltage $V_{SS}=-2.0$ V of the negative polarity power source is applied to the input terminals A and B, the two enhancement-mode junction FETs $Q_1$ and $Q_2$ are turned off and no current flows between the source and drain, so that a voltage drop hardly occurs due to the load resistor R. Since the output terminal OUT is connected to the input terminal of the logic gate at the next stage, however, a very small gate current of the junction FET of the input section at the next stage flows. Even by such a small current, a voltage drop which is almost equal to the turn-on voltage of 0.8 V occurs across the Schottky barrier diode SBD due to the strong nonlinearity of the current-voltage characteristics of the Schottky barrier diode SBD. Thus, $-0.8$ V which is lower than the power source voltage $V_{DD}=0$ V of the positive polarity power source by 0.8 V is generated to the output terminal OUT. The potential at the output terminal OUT in this instance is set to logic "1".

An operating speed of a circuit at the next stage connected to the output terminal OUT will now be considered. When a difference between the potentials of a gate electrode and a source electrode of an enhancement-mode junction FET of an input section Of the circuit at the next stage is equal to 1.2 V, no hole is injected from the gate electrode into the GaAs substrate, so that a switching speed of the circuit is not reduced due to the accumulation effect of the holes.

Figure 7:
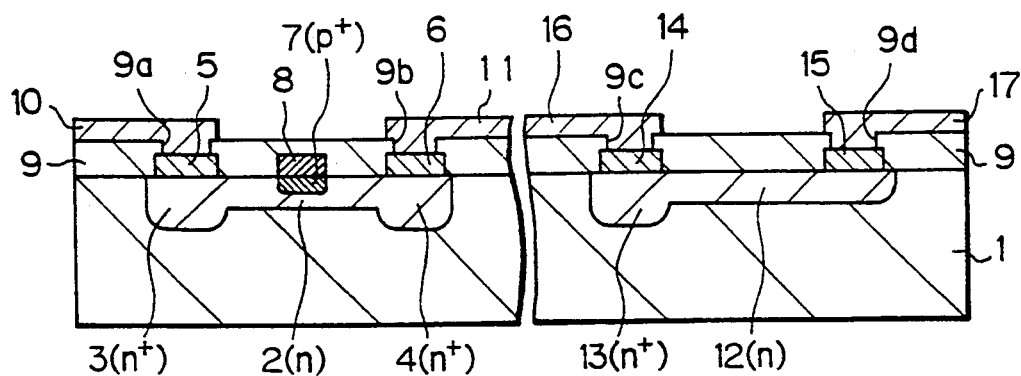
FIG. 7 is a cross sectional diagram showing a practical structure example of the compound semiconductor integrated circuit device according to the first embodiment of the invention.

FIG. 7 shows an example of a practical structure of the compound semiconductor integrated circuit device according to the first embodiment.

In FIG. 7, reference numeral 1 denotes a semiinsulating GaAs substrate; 2 an n-type region which is used as a channel region; 3 and 4 n+-type regions which are used as source regions or drain regions; 5 and 6 electrodes which are respectively come into ohmic contact with the n+-type regions 3 and 4 and are made of, for example, Au/Ge/Ni; 7 a p+-type gate region; and 8 a gate electrode. In this case, an enhancement-mode n-channel junction FET which is formed by the n-type region 2, n+-type regions 3 and 4, electrodes 5 and 6, gate region 7, and gate electrode 8 constructs the enhancement-mode junction FETs $Q_1$ and $Q_2$ in FIG. 6. Reference numeral 9 denotes an insulating film such as an $SiO_2$ film, and 10 and 11 indicate wirings made of, for example, Ti/Au. The wiring 10 is connected to the electrode 5 through an opening 9a formed in the insulating film 9. The wiring 11 is connected to the electrode 6 through an opening 9b formed in the insulating film 9.

Reference numeral 12 denotes an n-type region; 13 an n+-type region; 14 an electrode which is come into ohmic contact with the n+-type region 13 and is made of, for example, Au/Ge/Ni; 15 an electrode which forms a Schottky junction together with the n-type region 12 and is made of, for example, Ti/Pt/Au and 16 and 17 wirings made of, for example, Ti/Au. The wiring 16 is connected to the electrode 14 through an opening 9c formed in the insulating film 9. The wiring 17 is connected to the electrode 15 through an opening 9d formed in the insulating film 9. In this case, the resistor R in FIG. 6 is formed by the n-type region 12. The Schottky barrier diode SBD is formed by the electrode 15 and the n-type region 12.

An example of the structure shown in FIG. 7 can be realized by merely changing the material of the electrode 15 formed conventionally by an ohmic metal to the material forming the Schottky junction together with the n-type region 12. Therefore, an increase in occupation area which occurs when the Schottky barrier diode SBD is provided does not occur. That is, the Schottky barrier diode SBD can be added without increasing the occupation area.

According to the first embodiment as mentioned above, since the Schottky barrier diode SBD is provided between the positive polarity power source and the load resistor R in the E/R type DCFL circuit, even when a power source of $-2.0$ V which is used as a power source in an Si ECL IC or the like is used, the problem such that the switching speed is deteriorated due to the accumulation effect caused by the injection of the holes into the GaAs substrate form the gate electrode as in the conventional device does not occur. In the compound semiconductor integrated circuit device according to the first embodiment, since there is a compatibility of the power source with the Si ECL IC, even in the case where the compound semiconductor integrated circuit device according to the first embodiment is commonly used with the Si ECL IC, it is sufficient to use a single power source.

Figure 8:
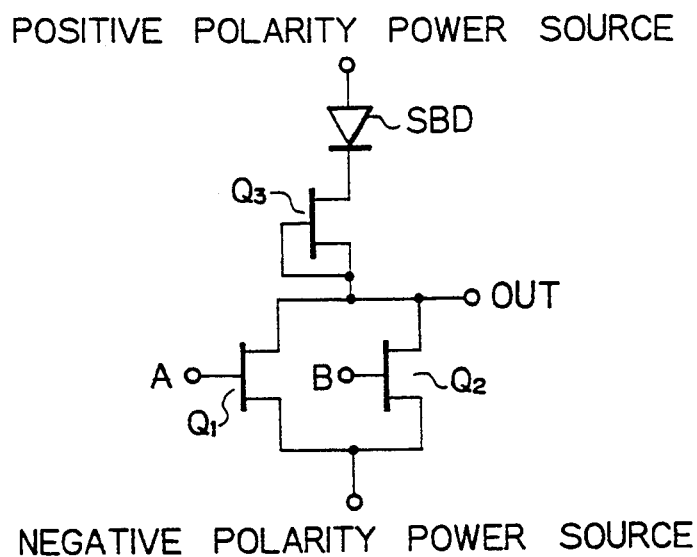
FIG. 8 is a circuit diagram showing an E/D type DCFL circuit which is used in a compound semiconductor integrated circuit device according to the second embodiment of the invention.

FIG. 8 shows a compound semiconductor integrated circuit device according to the second embodiment of the present invention.

As shown in FIG. 8, in the compound semiconductor integrated circuit device according to the second embodiment, one logic gate is constructed by the E/D type DCFL circuit in which the two enhancement-mode junction FETs $Q_1$ and $Q_2$ and the depletion-mode junction FET $Q_3$ are serially connected and the Schottky barrier diode SBD is serially connected between one end (drain) of the depletion-mode junction FET $Q_3$ and the positive polarity power source. The above example relates to the 2-input NOR logic circuit.

Figure 2:
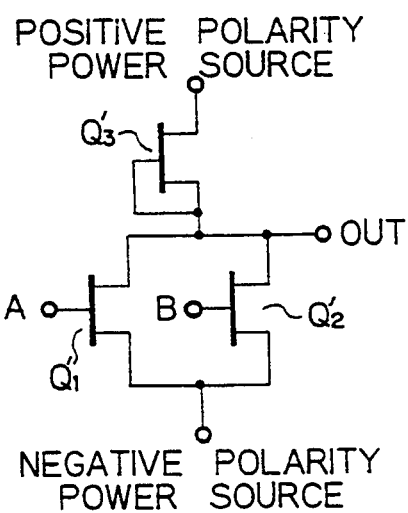
FIG. 2 is a circuit diagram showing a conventional E/D type DCFL circuit using junction FETs.

That is, the compound semiconductor integrated circuit device according to the second embodiment can be regarded as a device in which the Schottky barrier diode SBD is connected between the depletion-mode junction FET $Q_3'$ and the positive polarity power source in the conventional E/D type DCFL circuit shown in FIG. 2.

Since the operation of the compound semiconductor integrated circuit device according to the second embodiment is similar to the operation of the E/R type DCFL circuit shown in FIG. 6 except that the depletion-mode junction FET $Q_3$ is used in place of the load resistor R in the E/R type DCFL circuit shown in FIG. 6, its description is omitted here.

Figure 9:
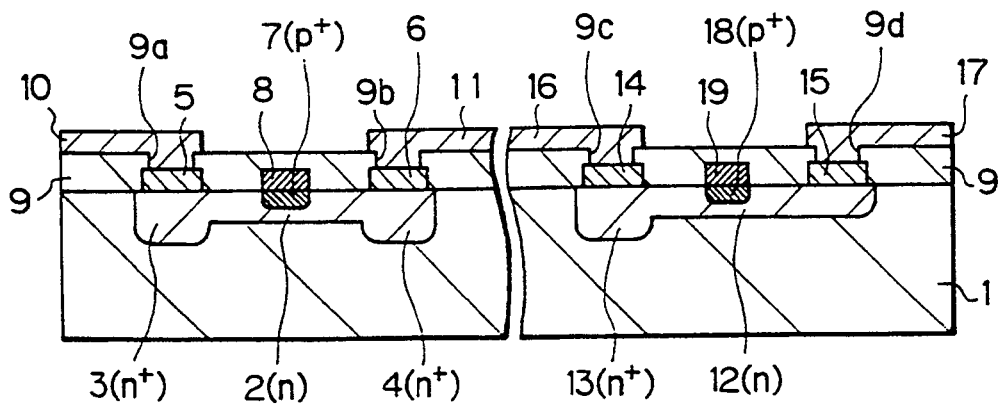
FIG. 9 is a cross sectional view showing a practical structure example of the compound semiconductor integrated circuit device according to the second embodiment of the invention.

An example of a practical structure of the compound semiconductor integrated circuit device according to the second embodiment is shown in FIG. 9.

As shown in FIG. 9, in the above structure example, a depletion-mode n-channel junction FET which is formed by the n-type region 12, n+-type region 13, electrode 14, a gate region 18 of, for example, p+-type, and a gate electrode 19 constructs the depletion-mode junction FET $Q_3$ in FIG. 8. The Schottky barrier diode SBD is formed by the n-type region 12 which is used as a channel region of the depletion-mode junction FET $Q_3$ and the electrode 15 formed by a metal such as Ti/Pt/Au which forms the Schottky junction together with the n-type region 12. Since the other construction is similar to that of the structure example shown in FIG. 6, its description is omitted here.

As described above, according to the second embodiment, since the Schottky barrier diode SBD is provided between the positive polarity power source and the depletion-mode junction FET $Q_3$ in the E/D type DCFL circuit, in the same manner as the first embodiment, even when the power source of $-2.0$ V which is used as a power source in the Si ECL IC or the like is used, a problem such that the switching speed is deteriorated due to the accumulation effect caused by the injection of the holes into the GaAs substrate from the gate electrode as in the conventional device does not occur. In the compound semiconductor integrated circuit device according to the second embodiment, since there is a compatibility of the power source with the Si ECLiiIC, even in the case where the compound semiconductor integrated circuit device according to the second embodiment is commonly used with the Si ECL IC, it is sufficient to use a single power source.

By using the structure as shown in FIG. 9, there is no increase in occupation area by providing the Schottky barrier diode SBD.

Figure 10:
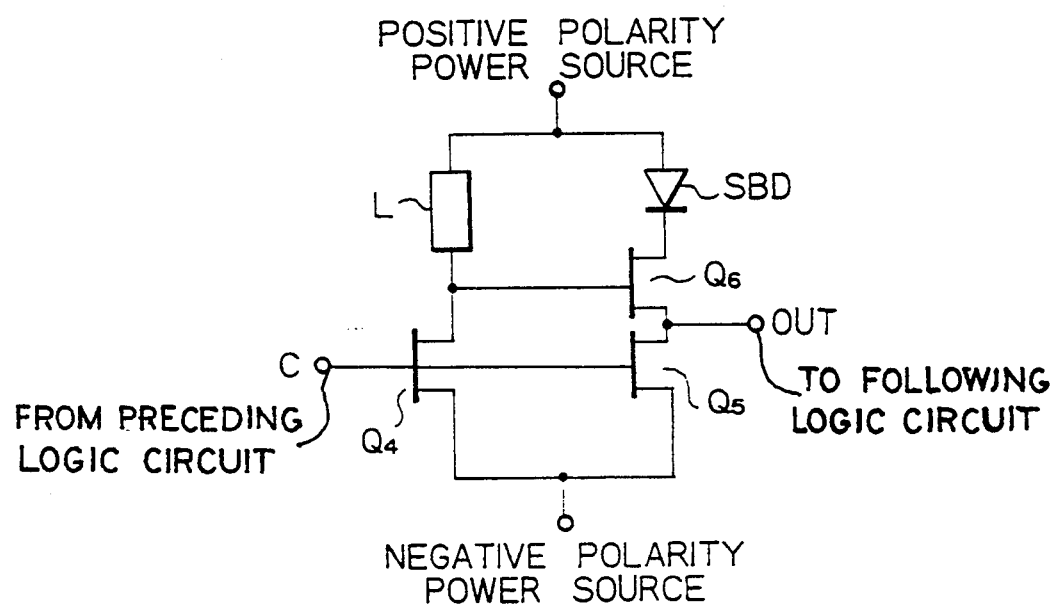
FIG. 10 is a circuit diagram showing a super buffer circuit which is Used in a compound semiconductor integrated circuit device according to the third embodiment of the invention.

FIG. 10 shows a compound semiconductor integrated circuit device according to the third embodiment of the present invention. In the compound semiconductor integrated circuit device according to the third embodiment, a super buffer circuit is used together with the E/R type DCFL circuit or E/D type DCFL circuit.

As shown in FIG. 10, in the compound semiconductor integrated circuit device according to the third embodiment, a super buffer circuit is constructed by serially connecting an enhancement-mode junction FET $Q_4$ and a load element L, by serially connecting an enhancement-mode junction FET $Q_5$ and an enhancement-mode junction FET $Q_6$ and further by connecting the Schottky barrier diode SBD between the enhancement-mode junction FET $Q_6$ and the positive polarity power source, A circuit in Case of using a resistor as a load element L corresponds to the E/R type. A circuit in case of using a depletion-mode junction FET as a load element L corresponds to the E/D type. One end of the load element L and an anode of the Schottky barrier diode SBD are connected to the positive power source to supply the power source voltage $V_{DD}$. One end (source) of each of the enhancement-mode junction FETs $Q_4$ and $Q_5$ is connected to the negative polarity power source to supply the power voltage $V_{SS}$. A common gate voltage is applied to gate electrodes of the enhancement-mode junction FETs $Q_4$ and $Q_5$. A connection point of the enhancement-mode junction FET $Q_4$ and the load element L is connected to a gate electrode of the enhancement-mode junction FET $Q_6$.

The operation of the super buffer circuit shown in FIG. 10 will now be described as follows.

It is sufficient to select the power source voltage $V_{DD}$ of the positive polarity power source and the power source voltage $V_{SS}$ of the negative polarity power source so that a difference between the power source voltages $V_{DD}$ and $V_{SS}$ is equal to 2.0 V. Therefore, the power source voltage $V_{DD}$ of the positive polarity power source is set to 0 V and the power source voltage $V_{SS}$ of the negative polarity power source is set to $-2.0$ V in consideration of the use of $-2.0$ V which is used in the Si ECL IC.

When a voltage which is equal to or higher than a threshold voltage (about 0.2 V) for the power source voltage $V_{SS} = -2.0$ V of the negative polarity power source is applied to the input terminal C, the enhancement-mode junction FET $Q_4$ is turned on and a current flows between the source and drain, so that an enough low voltage is applied to a gate terminal of the enhancement-mode junction FET $Q_6$ due to a voltage drop by the load element L. Therefore, the enhancement-mode junction FET $Q_6$ is turned off. The enhancement-mode junction FET $Q_5$ is in the ON state because the same gate voltage as that of the enhancement-mode junction FET $Q_4$ is applied. Thus, a voltage near the power source voltage $V_{SS} = -2.0$ V of the negative polarity power source appears at the output terminal OUT. Such a potential is set to logic "0".

When a voltage which is equal to or lower than the threshold voltage for the power source voltage $V_{SS} = -2.0$ V of the negative polarity power source is applied to the input terminal C, the enhancement-mode junction FET $Q_4$ is turned off and no current flows between the source and drain, so that a voltage drop due to the load element L hardly occurs. Thus, a voltage which is equal to the power source voltage $V_{DD}$ is applied to the gate terminal of the enhancement-mode junction FET $Q_6$. The enhancement-mode junction FET $Q_5$ is in the OFF state because the same gate voltage as that of the enhancement-mode junction FET $Q_4$ is applied. Therefore, a load capacitance due to the wiring connected to the output terminal OUT and an enhancement-mode junction FET at the next stage is charged at a high speed by a drain current of the enhancement-mode junction FET $Q_6$ and an output voltage rises (refer to the region 1 in FIG. 5). However, since an input terminal of a logic gate at the next stage is connected to the output terminal OUT, when the output voltage rises, a small gate current of the enhancement-mode junction FET in the input section at the next stage flows. Even by such a small gate current, a voltage drop which is almost equal to a turn-on voltage of 0.8 V occurs across the Schottky barrier diode SBD due to the strong nonlinearity of the current-voltage characteristics of the Schottky barrier diode SBD. Thus, a voltage of $-0.8$ V which is lower than the power source voltage $V_{DD}=0$ V of the positive polarity by 0.8 V is generated to the output terminal OUT. Such a potential is set to logic "1".

Figure 5:
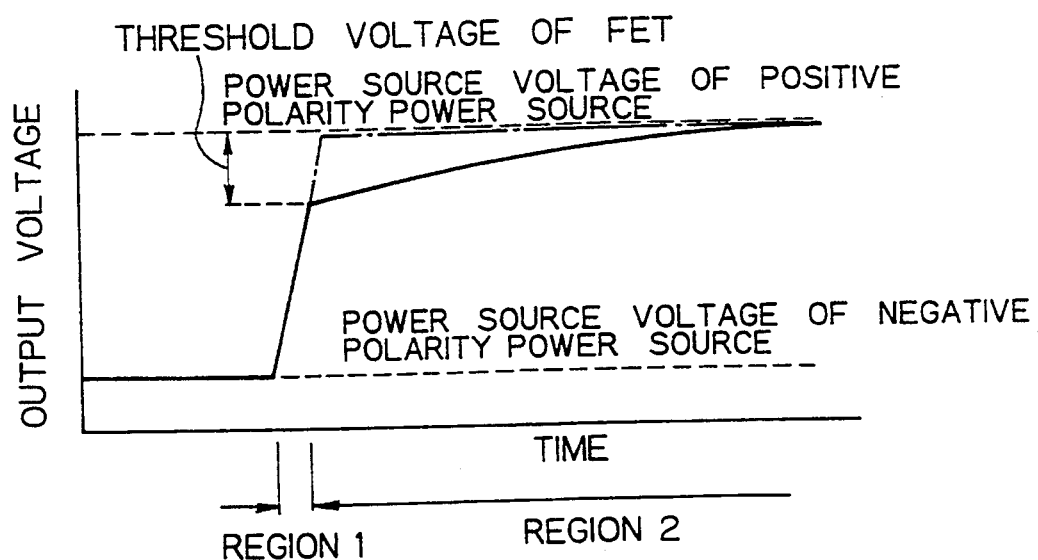
FIG. 5 is a graph showing a time-dependent change of an output voltage of the conventional super buffer circuit shown in FIG. 3.

An operating speed of the circuit at the next stage will now be considered. When a difference between the potentials of the gate electrode and the source electrode of the enhancement-mode junction FET of the input section of the circuit is equal to 1.2 V, no hole is injected from the gate electrode into the GaAs substrate. Therefore, the switching speed of the circuit is not reduced due to the accumulation effect of the holes. On the other hand, the enhancement-mode junction FET $Q_6$ is in the ON state because a voltage of 0.8 V corresponding to the voltage drop by the Schottky barrier diode SBD is applied between the gate and source. Therefore, the slow change in output voltage which causes a problem in the conventional super buffer circuit shown in FIG. 3 does not occur. That is, as shown in FIG. 5, even in the region 2, the output voltage rapidly rises up to the power source voltage $V_{DD}$ of the positive polarity power source as shown by an alternate long and short dash line.

Since a practical structure of the compound semiconductor integrated circuit device according to the third embodiment is similar to that in FIG. 9, its description is omitted.

Figure 3:
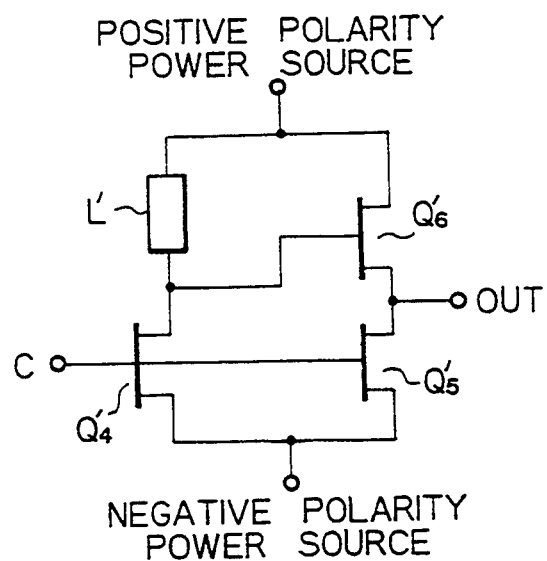
FIG. 3 is a circuit diagram showing a conventional super buffer circuit.
Figure 4:
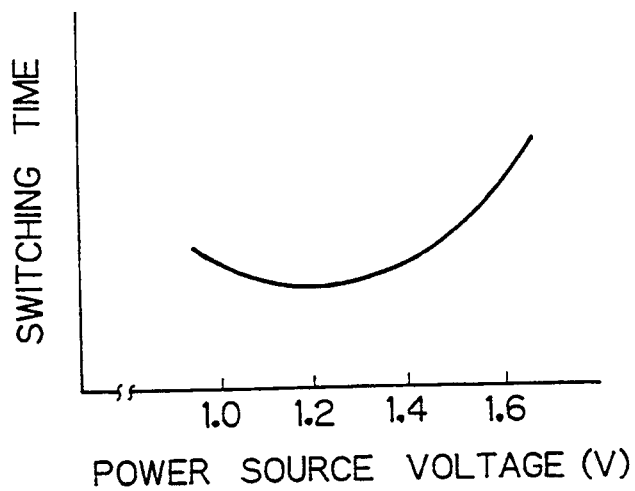
FIG. 4 is a graph showing the relation between the switching time and the power source voltage in the conventional E/R type DCFL circuit using junction FETs.

According to the third embodiment as mentioned above, in the super buffer circuit, since the Schottky barrier diode SBD is connected between the enhancement-mode junction FET $Q_6$ and the positive polarity power source, the problem of a slow change in output voltage which occurs in the conventional super buffer circuit shown in FIG. 3 is eliminated.

By using the structure as shown in FIG. 9, there is no increase in occupation area due to the addition of the Schottky barrier diode SBD.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For instance, in the above first and second embodiments, the Schottky barrier diode SBD and the load resistor R or the depletion-mode junction FET $Q_3$ can be also replaced.

In the above second embodiment, for example, a depletion-mode MESFET can be also used in place of the depletion-mode junction FET $Q_3$.

Furthermore, another kind of diode can be also used in place of the Schottky barrier diode SBD in the above first, second, and third embodiments.

Further, the structure examples shown in FIGS. 7 and 9 are merely shown as examples and other structures different from them can be also used.

As mentioned above, according to the invention, in the compound semiconductor integrated circuit device using the E/R type DCFL circuit Or E/D type DCFL circuit, even when the power source voltage of 2 V is used, the deterioration of the switching speed can be prevented and even in case of using such a device together with the Si IC, the power source can be commonly used. The problem of a slow increase in output voltage in the super buffer circuit can be also prevented.

What is claimed is:

1. A compound semiconductor integrated circuit device including:
   first and second power source nodes at a respective first and second voltages, said second voltage being lower than said first voltage;
   a direct coupled FET logic circuit comprising at least one input node and one output node and at least one enhancement-mode junction FET, said enhancement mode junction FET having a gate and first and second ends, said first end being electrically coupled to said output node, said second end being electrically coupled to said second power source node; and
   a resistor and a diode coupled in series between said first power source node and said output node of said direct coupled FET logic circuit, said diode being coupled between said first power source node and said resistor.

2. An integrated circuit device made with a compound semiconductor, comprising:
   first and second power source nodes at respective first and second voltages, said second voltage being lower than said first voltage;
   a direct coupled FET logic circuit comprising at least one input node and one output node and at least one enhancement-mode junction FET, said enhancement mode junction FET having a gate and first and second ends, said first end being electrically coupled to said output node, said second end being electrically coupled to said second power source node; and
   a diode and a depletion mode junction FET serially connected between said first power source node and said output node of said direct coupled FET logic circuit, said diode being coupled between said first power node and said depletion mode junction FET.

3. An integrated circuit device made with a compound semiconductor, including a buffer circuit comprising:
   first and second power source nodes at respective first and second voltages, said second voltage being lower than said first voltage;
   a load and a first enhancement mode junction FET serially connected between the first and second power source nodes, said load being coupled between said first power source node and said first enhancement mode FET; and
   a diode and second and third enhancement mode junction FETs serially connected between said first and second power source nodes, said diode being coupled between said first power source node and said second enhancement mode junction FET, said second enhancement junction FET being coupled between said diode and said third enhancement mode junction FET, an anode of the diode being coupled to the first power source node, said first and third enhancement mode junction FETs having commonly coupled gates which in turn are coupled to a buffer input node, said second enhancement mode junction FET having a gate coupled to a node between said load and said first enhancement mode junction FET, an output node being provided between said second and third enhancement mode junction FETs.

4. An integrated circuit device as set forth in claim 1, 2 or 3, wherein said diode is a Schottky barrier diode.

5. The integrated circuit device of claim 3, wherein said load comprises a depletion mode junction FET transistor.

6. The integrated circuit device of claim 3 wherein said load comprises a resistor.

* * * * *